United States Patent [19]
Burroughs et al.

[11] Patent Number: 6,076,136
[45] Date of Patent: Jun. 13, 2000

[54] RAM ADDRESS DECODING SYSTEM AND METHOD TO SUPPORT MISALIGNED MEMORY ACCESS

[75] Inventors: William G. Burroughs, Macungie; Charles Raymond Miller, Shickshinny, both of Pa.

[73] Assignee: Lucent Technologies, Inc., Murray Hill, N.J.

[21] Appl. No.: 09/099,885

[22] Filed: Jun. 17, 1998

[51] Int. Cl.$^7$ .................................................. G06F 12/00
[52] U.S. Cl. .............................. 711/5; 711/109; 711/127; 711/129; 365/230.03; 365/230.04
[58] Field of Search ................................ 711/5, 109, 127, 711/129, 147, 152, 157; 365/230.03, 230.04

[56] References Cited

U.S. PATENT DOCUMENTS

| | | | |
|---|---|---|---|
| 4,381,541 | 4/1983 | Baumann, Jr. et al. | 364/200 |
| 4,688,188 | 8/1987 | Washington | 711/114 |
| 4,783,736 | 11/1988 | Ziegler et al. | 364/200 |
| 5,353,243 | 10/1994 | Read et al. | 364/578 |
| 5,625,580 | 4/1997 | Read et al. | 364/578 |
| 5,848,258 | 12/1998 | Fenwick et al. | 711/5 |
| 5,881,009 | 3/1999 | Tomita | 365/221 |

*Primary Examiner*—Do Hyun Yoo
*Assistant Examiner*—Mehdi Namazi
*Attorney, Agent, or Firm*—Ratner & Prestia

[57] ABSTRACT

A memory access system is provided for accessing a first data unit and a second data unit in a single memory access cycle. The memory access system provides at least a memory, an even address decoding circuit, an odd address decoder, and shift logic. The memory is interleaved by at least one address bus signal into an even memory bank and an odd memory bank. The even memory bank and the odd memory bank are each organized by a plurality of corresponding rows. Each one of the rows contains at least one storage location for a data unit, with one address mapped to one storage location. The even address decoding circuit decodes an address bus signal supplied to the input terminal and activates an output terminal coupled to enable the given row of the even memory bank. The odd address decoder decodes the address bus signal to activate an output terminal coupled to enable the row of the odd memory bank in which the first data unit resides. The shift logic processes input signals indicating a mis-aligned access of multiple data units to produce a shift signal, and the even address decoding circuit is responsive to the shift signal to increment or shift the output terminal activated by decoding the address bus signal. The first data unit is made accessible by enabling the given row of the odd memory bank, and the second data unit is made accessible by enabling the next sequential row of the even memory bank.

18 Claims, 7 Drawing Sheets

RAM ADDRESS DECODING SYSTEM AND METHOD TO SUPPORT MISALIGNED MEMORY ACCESS

BACKGROUND

High-performance Digital Signal Processors (DSPs), such as the DSP16210 manufactured by the assignee of this application, frequently need to fetch from memory a number of data units such as a doubleword (two sequential words) in a given instruction cycle. Given a starting address of, for example, a doubleword, a memory access system must attempt to access both the word residing at the starting address and the word residing at the next sequential address in a single instruction cycle. If the starting address is even, the access is said to be aligned. If the starting address for a given access is odd, the access is said to be misaligned.

Figure 1:
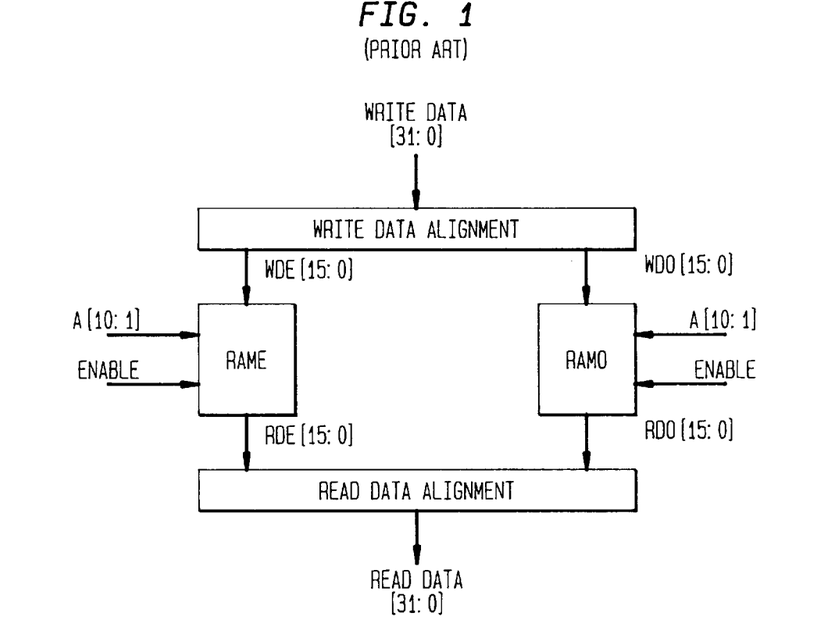
FIG. 1 is a block diagram of a conventional interleaved memory system.

FIG. 1 is a block diagram of a conventional interleaved memory access system. A data bus supplies 32 bits of write data to the write data alignment logic, which separates the 32 bits of data into 16 bits of data directed to an even memory bank RAME and 16 bits of data directed to an odd memory bank RAMO. Within the memory banks RAME and RAMO, individual locations are selected by address bus signals A[10:1], and the memory banks RAME and RAMO are selected for operation by an ENABLE signal. For read operations, the memory banks RAME and RAMO each provide 16 bits of data to the read data alignment logic. The address bus signal A[0] is used to select between the memory banks RAME and RAMO.

When the starting address is even and the access is aligned, standard low-order memory interleaving techniques permit access to both the first and the second words in the same instruction cycle. Such standard techniques decode the starting address to select a given row in both an even and an odd memory bank. For an aligned access with the starting address being even, the even memory bank provides the first word and the odd memory bank provides the second word, and both of the words reside in the selected row. Thus, for aligned accesses both words are accessed in the same instruction cycle.

For a mis-aligned access with the starting address being odd, standard low-order memory interleaving techniques typically cannot access both the first and the second words in the same instruction cycle. When the starting address is odd, the odd memory bank provides the first word, and the even memory bank provides the second word. However, when the starting address is odd, the row of the memory banks selected by decoding the starting address contains only the first word in the odd memory bank. The second word resides in the even memory bank at the next sequential address, which is in the next sequential row. Since conventional interleaved memory systems cannot typically enable and access two different rows in the same instruction cycle, a second instruction cycle is necessary to access the second word in the even memory bank. These additional instruction cycles slow memory accesses and degrade overall system performance.

Figure 2:
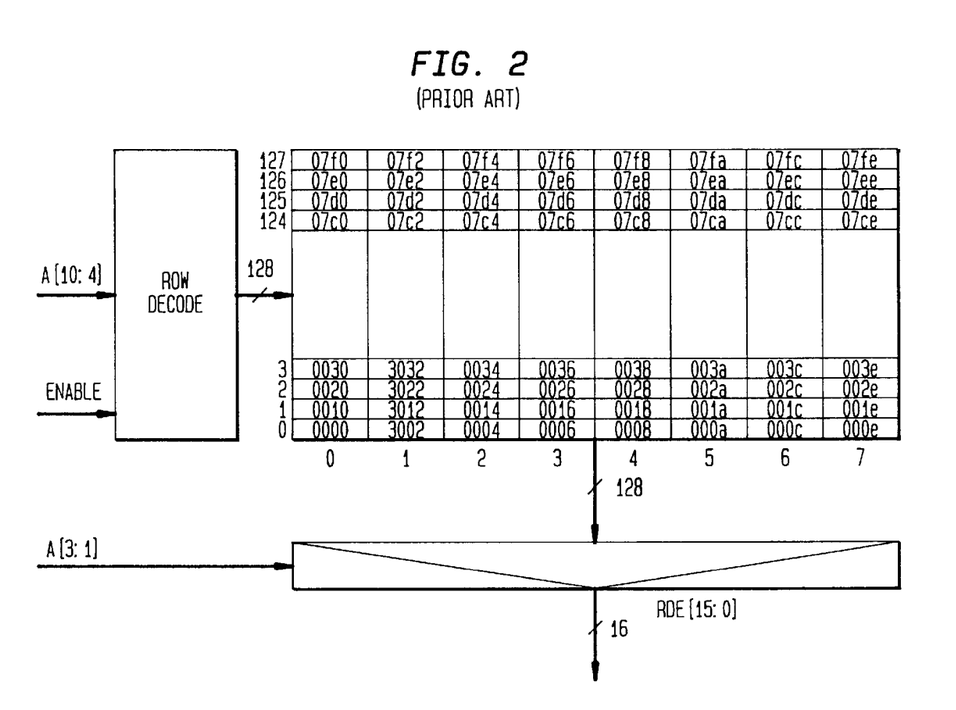
FIGS. 2 and 3 are detailed block diagrams of conventional interleaved memory system.
Figure 3:
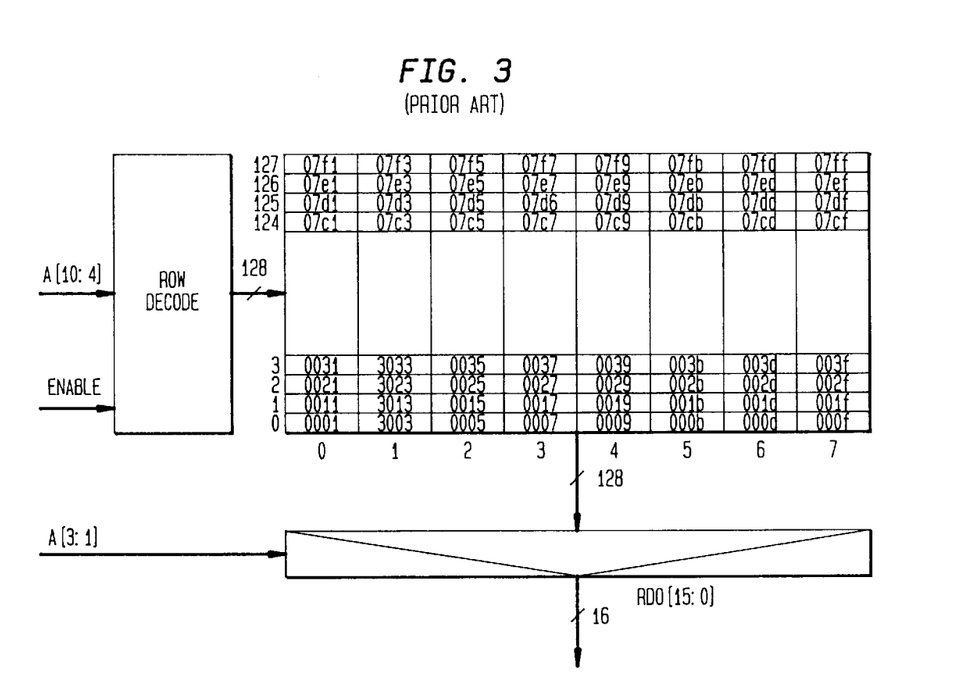

FIGS. 2 and 3 are block diagrams of conventional interleaved memory systems. FIG. 2 shows an even memory bank mapped to the address range 0x07fe:0x0000, while FIG. 3 shows a corresponding odd memory bank mapped to the address range 0x07ff:0x0001. The problem of conventional RAM address decoding may be illustrated by considering an example of a mis-aligned doubleword access. For example, consider a mis-aligned doubleword access with a starting address of 0x0003. The memory access system must access the first word residing at the odd address 0x0003 and the second word residing at the even address 0x0004. In FIG. 3, the odd first address 0x0003 decodes to row 0, column 1. In FIG. 2, the even second address 0x0004 decodes to row 0, column 2. Because 0x0003 and 0x0004 decode to different storage locations in different rows and columns in the even and odd memory banks, the memory access system of FIGS. 2 and 3 must run a second cycle to access the second word, and thus cannot typically service a mis-aligned doubleword access in a single memory access.

In contrast, referring to FIGS. 2 and 3, for an aligned doubleword access with an even starting address of 0x0002, the even memory bank in FIG. 2 decodes 0x0002 to select row 0, column 1. The odd memory bank in FIG. 3 decodes the odd address 0x0003 to select the same row and column. Because both memory banks decode the same row and column, the memory access system of FIGS. 2 and 3 can typically access both words of an aligned access in a single cycle.

There are several solutions to the above shortcomings of conventional memory address decoding for mis-aligned accesses. One approach is to employ a look-ahead buffer and pre-fetch misaligned data into that buffer, thereby priming that buffer with the data that might later be sought through misaligned memory accesses. However, this approach suffers several disadvantages, including the additional hardware required to support the buffer, the additional instruction cycles required to load the buffer, the processing overhead required to maintain the integrity of the buffer with respect to the external memory.

Another approach is to ensure that code fetches, as opposed to data fetches, are always aligned, thereby at least optimizing code fetches. The costs of this approach are more complicated code fetching logic and an extra clock delay required for code branches to odd addresses as compared to even addresses.

Accordingly, there is a need in the art for a memory access system and method that supports misaligned accesses, preferably providing single-cycle access to two sequential data units, such as a doubleword comprising two consecutive words, when the starting address is odd. It is an objective of the present invention to provide such a system and method.

SUMMARY

The present invention provides a memory access system for accessing a first data unit and a second data unit in a single memory access cycle. These data units could be, for example, two consecutively-addressed words of a given size for a given processor. For a mis-aligned access, the first data unit resides at an odd starting address A that is asserted on an address bus, and the second data unit residing at the next sequential even address A+1. The memory access system comprises at least a memory, even address decoding circuitry, an odd address decoder, and shift logic.

The memory is interleaved by at least one address bus signal into an even memory bank, which is mapped to even addresses, and an odd memory bank, which is mapped to odd addresses. The even memory bank and the odd memory bank are each organized by a plurality of corresponding rows. The word "corresponding" in this context means that the interleaved memory is symmetrical and that the even and odd memory banks contain the same number of rows. Each one of the rows contains at least one storage location for a data unit, with one address mapped to one storage location. The first data unit resides at the odd starting address A in the odd memory bank at a row denoted generally as X, and the second data unit resides at the next sequential even address A+1 in the even memory bank at a row denoted generally as X+1.

The even address decoding circuitry includes at least one input terminal and a plurality of output terminals. The input terminal is coupled to the address bus to receive an address bus signal representing the odd starting address A. One each of the output terminals is coupled to enable one each of the rows of the even memory bank. The even address decoding circuitry decodes the address bus signal supplied to the input terminal and activates an output terminal X coupled to the row X of the even memory bank.

The odd address decoder includes at least one input terminal and a plurality of output terminals. The at least one input terminal is coupled to the address bus to receive the address bus signal representing the odd starting address A. One each of the output terminals is coupled to enable one each of the rows of the odd memory bank. The odd address decoder decodes the address bus signal to activate an output terminal X of the odd address decoder. In this manner, activating the output terminal X enables the row X of the odd memory bank to which the output terminal X is coupled. Once the row X is enabled, the first data unit residing at the odd starting address A and contained in the storage location in the row X is accessible.

The shift logic includes a plurality of input terminals and at least one output terminal. Each one of the input terminals receives a signal, and the shift logic receives a first signal indicating that the starting address A is odd, and a second signal indicating that multiple data units are being accessed in the single memory access cycle. The shift logic processes the first the second signals to produce a shift signal, and the even address decoding circuitry is coupled to receive this shift signal. The even address decoding circuitry is responsive to this shift signal to increment the activated output terminal X. In this manner, the even address decoding circuitry activates the output terminal X+1 and enables the row X+1 of the even memory bank for access.

The first data unit is made accessible by enabling the row X of the odd memory bank and the second data unit is made accessible by enabling the row X+1 of the even memory bank. The row X+1 is enabled when the starting address A is odd and multiple data units are accessed in the same memory access cycle.

DETAILED DESCRIPTION OF THE EXEMPLARY EMBODIMENT

The invention will be better understood by consideration of the following drawings, wherein identical reference numerals denote identical components.

Figure 4:
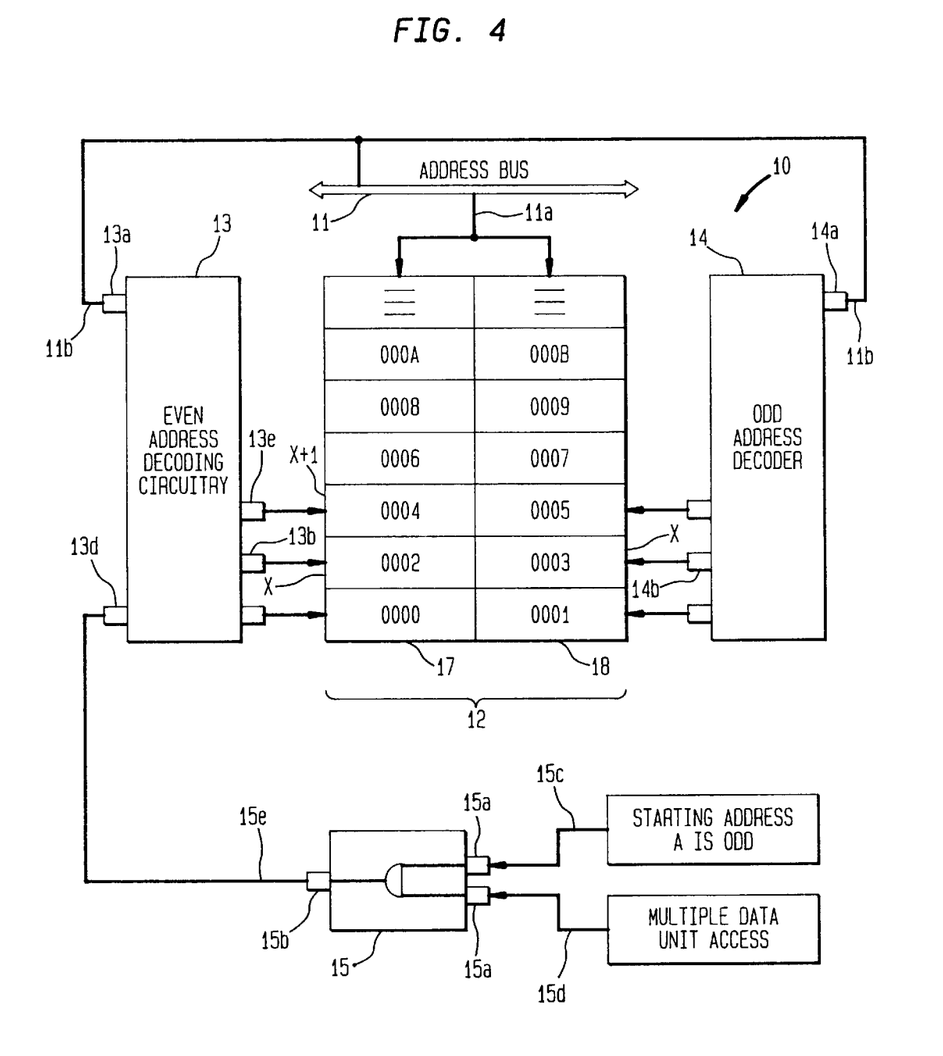
FIG. 4 is a block diagram of an exemplary embodiment of the invention.

FIG. 4 is a block diagram of an exemplary embodiment of the invention, which provides a memory access system 10 for accessing a first data unit and a second data unit in a single memory access cycle. For a mis-aligned access, the first data unit resides at an odd starting address A that is asserted on an address bus 11, and the second data unit residing at the next sequential even address A+1. The memory access system 10 comprises at least a memory 12, an even address decoder 13, an odd address decoder 14, and shift logic 15.

The memory 12 is interleaved by at least one address bus signal 11a into an even memory bank 17, which is mapped to even addresses, and an odd memory bank 18, which is mapped to odd addresses. Address bus signal 11a is typically the lowest-order bit in address bus 11. The even memory bank 17 and the odd memory bank 18 are each organized by a plurality of corresponding rows. The word "corresponding" in this context means that the interleaved memory is symmetrical and that the even and odd memory banks 17 and 18 contain the same number of rows. Each one of the rows contains at least one storage location for a data unit, with one address mapped to one storage location. For a mis-aligned access, the first data unit resides at the odd starting address A in the odd memory bank 18. The first data unit can be accessed in a row denoted generally as X, and the second data unit resides at the next sequential even address A+1 in the even memory bank 17 at a row denoted generally as X+1. For example, if the first data unit is contained in an odd starting address 0×0003, then the row labeled X in the odd memory bank 18 contains the first data unit and the row labeled X+1 contains the second data unit in the even memory bank 17.

The even address decoding circuitry 13 includes at least one input terminal 13a and a plurality of output terminals 13b. The input terminal 13a is coupled to the address bus 11 to receive an address bus signal 11b representing the odd starting address A. One each of the output terminals 13b is coupled to enable one each of the rows of the even memory bank 17. The even address decoder 13 includes sub-circuitry (not shown) coupled between the input terminal 13a and each of the output terminals 13b, and this sub-circuitry decodes the address bus signal supplied to the input terminal. In the above example, the sub-circuitry initially activates the output terminal 13b coupled to the row X of the even memory bank 17.

The odd address decoder 14 includes at least one input terminal 14a and a plurality of output terminals 14b. The input terminal 14a is coupled to the address bus 11 to receive the address bus signal 11b representing the odd starting address A. One each of the output terminals 14b is coupled to enable one each of the rows of the odd memory bank 18. In the above example, the odd address decoder 14 decodes the address bus signal 11b to activate the output terminal 14b coupled to the row X of the odd memory bank 18. The odd address decoder 14 includes sub-circuitry (not shown) that decodes the address bus signal on line 11b to select one of the output terminals 14b. In the above example, activating the output terminal 14b enables the row X of the odd memory bank 18 to which the output terminal 14b is coupled. Once the row X is enabled, the first data unit residing at the odd starting address A and contained in the storage location in the row X is accessible in the odd memory bank 18.

The shift logic 15 determines when the row shift operation takes place and includes a plurality of input terminals 15a and at least one output terminal 15b. Each one of the input terminals 15a receives a signal. The shift logic 15 receives a first signal on line 15c indicating that the starting address A is odd, and a second signal on line 15d indicating that multiple data units are being accessed in the single memory access cycle. The shift logic 15 processes the first and the second signals to produce a shift signal on line 15e, and the even address decoding circuitry 13 is coupled to receive the shift signal through shift terminal 13d. The even address decoding circuitry 13 is responsive to the shift signal to increment the output terminal 13b activated by decoding the odd starting address A. The output terminal 13b is deactivated in favor of the next higher-order output terminal 13e. This shifting function is readily implemented by adding a pass-gate multiplexer to a decoder circuit, as illustrated and discussed below in connection with FIG. 8. In the example above, activating the output terminal 13e enables the row X+1 of the even memory bank 17 for access.

The first data unit is made accessible by enabling the row X of the odd memory bank 18 and the second data unit is made accessible by enabling the row X+1 of the even memory bank 17. The row X+1 is enabled when the starting address A is odd and multiple data units are accessed in the same memory access cycle. In the above example, with the address 0x0003 asserted as the starting address, the odd address decoder 14 activates row X to access 0x0003, and the even address decoding circuitry 13 shifts to activate row X+1 of the even memory bank 17, thereby making the second data unit at 0x0004 accessible in the same cycle.

The even address decoding circuitry 13 includes a shift terminal 13d coupled to the output terminal 15b of the shift logic 15. The even address decoding circuitry 13 and the odd address decoder 14 can each include N input terminals 13a and 14a, where N is an integer greater than zero. It should be understood that one or more address bus signals can be supplied to the even address decoding circuitry 13 and the odd address decoder 14, depending on the requirements of a given addressing scheme. These N input terminals 13a and 14a can be coupled to receive N address bus signals representing the odd starting address A.

Because the even address decoding circuitry 13 and the odd address decoder 14 typically decode a binary signal applied to their input terminals 13a and 14a, the even address decoding circuitry 13 and the odd address decoder 14 each include 2^N output terminals 13b and 14b. In this case, the even and the odd memory banks 17 and 18 also each include 2^N rows. Each of the 2^N output terminals 13b of the even address decoding circuitry 13 are coupled to enable one of the 2^N rows of the even memory bank 17, and each of the 2^N output terminals 14b of the odd address decoder 14 are coupled to enable one of the 2^N rows of the odd memory bank 18.

Figure 5:
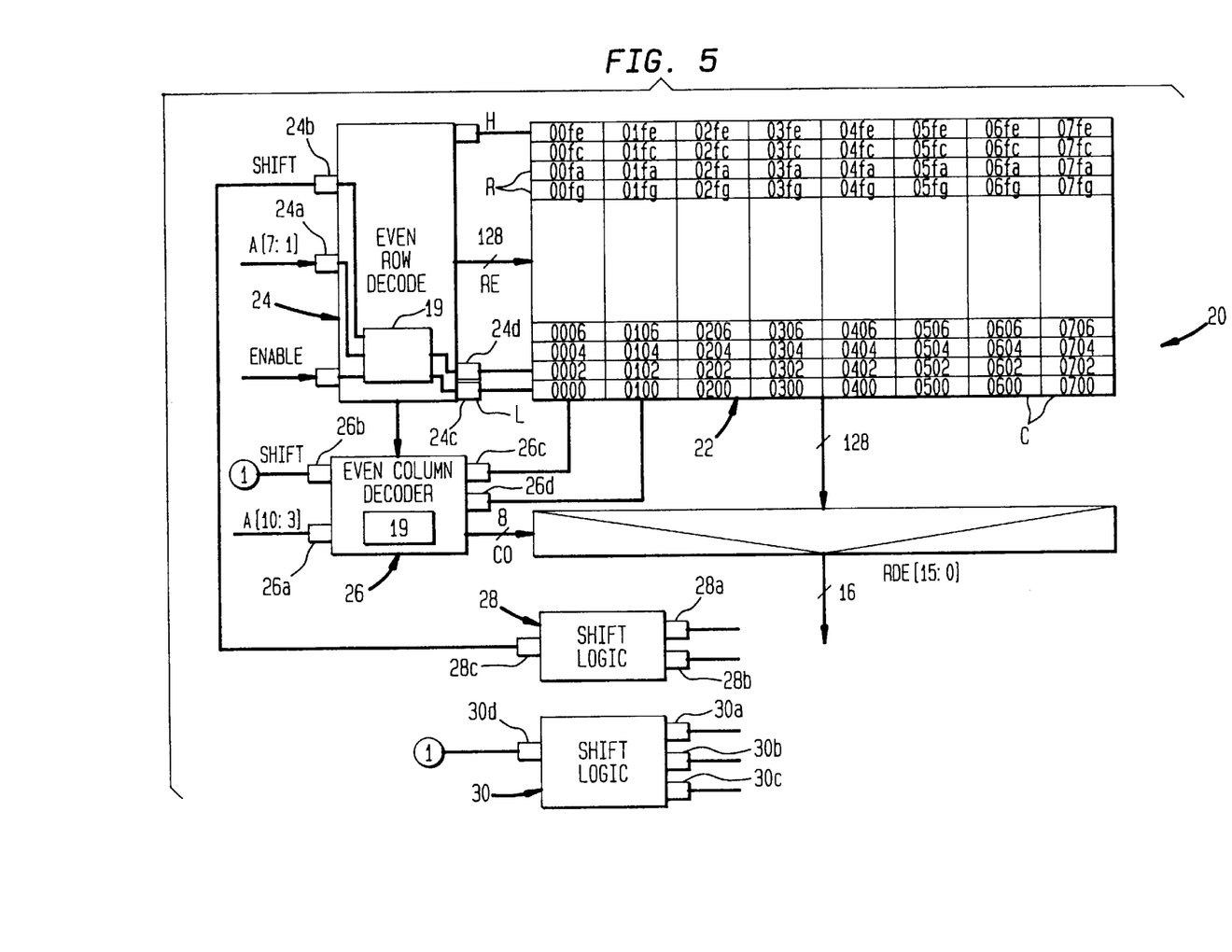
FIGS. 5 and 6 are block diagrams of even and odd memory banks constructed according to one aspect of the invention.
Figure 6:
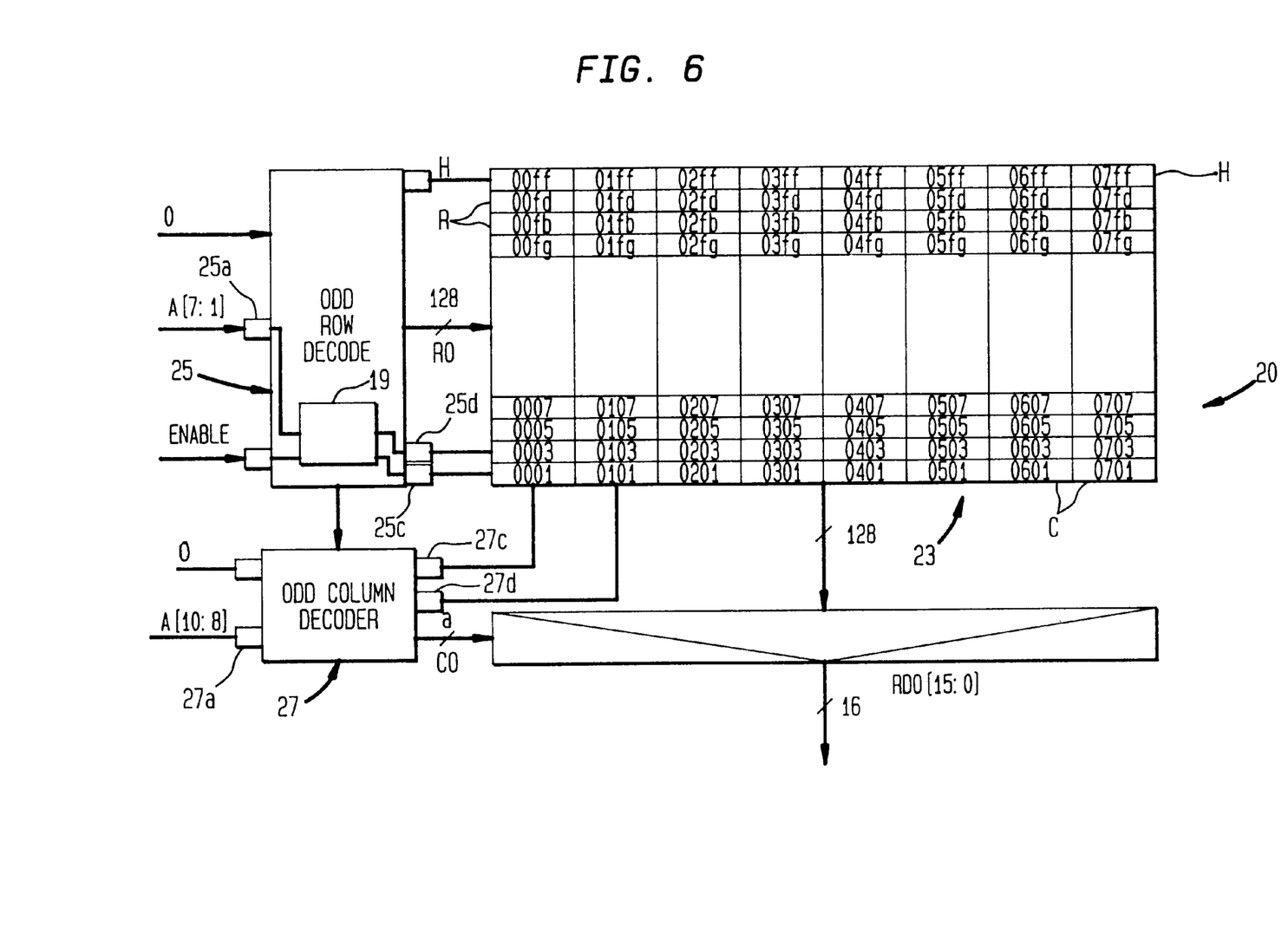

FIGS. 5 and 6 are a block diagrams of even and odd interleaved memory banks constructed in accordance with another aspect of the invention. FIGS. 5 and 6 illustrate different aspects of a memory access system 20 for accessing a first data unit and a second data unit in a single memory access cycle. FIG. 5 shows an even memory bank 22 mapped to even addresses 0x0000 to 0x07fe, and FIG. 6 shows an odd memory bank mapped to odd addresses 0x0001 through 0x07ff. For a mis-aligned access, the first data unit resides within the odd memory bank 23 at an odd starting address A asserted on an address bus (not shown), and the second data unit resides in the even memory bank 22 at the next sequential even address A+1. The memory access system 20 as illustrated in FIGS. 5 and 6 comprises at least the even memory bank 22, the odd memory bank 23, even row decoding circuitry 24, even column decoding circuitry 26, an odd row decoder 25, an odd column decoder 27, and shift logic 28.

The memory access system 20 shown in FIGS. 5 and 6 is interleaved by at least one address bus signal (not shown) into an even memory bank 22, which is mapped to a plurality of even addresses, and an odd memory bank 23, which is mapped to a plurality of odd addresses. The even memory bank 22 and the odd memory bank 23 are each subdivided into a matrix of storage locations by a plurality of corresponding rows and a plurality of corresponding columns. "Corresponding" refers to the symmetry between the even and odd memory banks 22 and 23, with each bank containing the same number of rows and columns. Within this matrix of storage locations, one address is mapped to one storage location.

Turning to FIG. 5, the even row decoding circuitry 24 includes at least one input terminal 24a, a shift terminal 24b, and a plurality of output terminals 24c and 24d. The input terminal 24a is coupled to the address bus (not shown) to receive a first address bus signal. One or more address bus signals may be supplied to the input terminal, depending on the requirements of a given addressing scheme. FIG. 5 shows seven address bus signals collectively represented as one signal. One each of the output terminals 24c and 24d is coupled to enable one each of the rows of the even memory bank 22. In this manner, each output terminal 24c and 24d corresponds to one row of the even memory bank 22.

The even row decoding circuitry 24 includes sub-circuitry (not shown) coupled between the input terminal 24a and the output terminals 24c and 24d to decode the first address bus signal to activate the output terminal 24c. The shift terminal 24b is coupled to the sub-circuitry, with the sub-circuitry being responsive to a signal supplied to the shift terminal 24b to shift from activating output terminal 24c to activating the output terminal 24d. By activating the output terminal 24d, the even row decoding circuitry 24 enables for access the row of the even memory bank 22 that is coupled to the output terminal 24d.

The even column decoding circuitry 26 includes at least one input terminal 26a and a plurality of output terminals 26c and 26d. The input terminal 26a is coupled to the address bus (not shown) to receive a second address bus signal. One or more address bus signals may be supplied to the even column decoding circuitry 26 depending on the requirements of a given addressing scheme. FIG. 5 shows three address bus signals collectively represented as one signal. Generally, the address bus signals supplied to the even column decoding circuitry 26 will be different than those supplied to the even row decoding circuitry 24. One each of the output terminals 26c and 26d are coupled to enable one each of the columns of the even memory bank 22. In this manner, each output terminal 26c and 26d corresponds to one column of the even memory bank 22.

The even column decoding circuitry 26 includes sub-circuitry (not shown) coupled between the input terminal 26a and the output terminals 26c and 26d, with the sub-circuitry decoding the second address bus signal to activate an output terminal 26c of the even column decoding circuitry 26. When the output terminal 26c is activated, a corresponding column of the even memory bank 22 is enabled for access.

Turning now to FIG. 6, the odd row decoder 25 includes at least one input terminal 25a and a plurality of output terminals 25c and 25d. The input terminal 25a is coupled to the address bus (not shown) to receive the first address bus signal. Generally, the same one or more address bus signals that are supplied to the even row decoder 24 are also supplied to the odd row decoder 25. One each of the output terminals 25c and 25d is coupled to enable one each of the rows R of the odd memory bank 23. In this manner, each output terminal 25c and 25d corresponds to one row of the odd memory bank 23. The odd row decoder 25 decodes the first address bus signal to activate an output terminal 25c and to enable the corresponding row of the odd memory bank 23 for access. The odd row decoder 23 includes circuitry 19 that decodes the address bus signals supplied to the input terminal 25a to select one of the output terminals 25c and 25d.

The odd column decoder 27 includes at least one input terminal 27a and a plurality of output terminals 27c and 27d. The input terminal 27a is coupled to the address bus to receive an address bus signal. It should be understood that one or more address bus signals may be supplied to the odd column decoder 27, depending on the requirements of a given addressing scheme. Generally, the same one or more address bus signals supplied to the even column decoder 26 are also supplied to the odd column decoder 27. One each of the output terminals 27c and 27d is coupled to enable one each of the columns C of the odd memory bank 23. In this manner, one output terminal 27c and 27d corresponds to one column of the odd memory bank 23. The odd column decoder 27 decodes the second address bus signal to activate an output terminal 27c and to enable a corresponding column of the odd memory bank 23. When the column coupled to output terminal 27c is enabled, the first data unit residing at the odd starting address A becomes accessible at row X, column Y of the odd memory bank.

Referring back to FIG. 5, the shift logic 28 determines when the row shift operation takes place, and includes a plurality of input terminals 28a and 28b and at least one output terminal 28c. The output terminal 28c is coupled to the shift terminal 24b of the even row decoder 24. Each one of the input terminals 28a and 28b may receive a signal, with the shift logic 28 receiving a first signal through input terminal 28a indicating that the address bus contains an odd address and a second signal through input terminal 28b indicating that multiple data units are being accessed in the current memory access cycle. The shift logic 28 processes the first and the second signals to produce a shift signal on the output terminal 28c. Typically, the shift logic 28 performs a logical AND on the two input signals to produce the shift signal indicating when both input signals are logically TRUE.

The operation of the memory access system 20 is understood by considering an example mis-aligned access with an odd starting address of 0x0001. The even row decoding circuitry 24 and the odd row decoder both decode a first portion of the odd starting address to select output terminals 24c and 25c, respectively. Likewise, even column decoding circuitry 26 and odd column decoder 27 decode a second portion of the odd starting address to select output terminals 26c and 27c, respectively. At this point, memory access system 20 has properly decoded the address of the first data unit at 0x0001 by activating row 0, column 0 of odd memory bank 23. However, the address for the second data unit is 0x0002, not the address 0x0000 currently decoded by activating row 0, column 0 of the even memory bank 22. Accordingly, shift logic 28 causes even row decoding circuitry 24 to activate output terminal 24d, thereby shifting the row of the even memory bank 22 enabled for access and decoding the correct address for the second data unit, 0x0002 by activating row 1, column 0 of the even memory bank 22.

Generalizing from the above example, the first data unit is made accessible by enabling a row X and a column Y in the odd memory bank 23. The second data unit is made accessible by enabling a row X+1 and a column Y of the even memory bank 22 when the starting address A is odd and when multiple data units are accessed in the single memory access cycle.

Generally, the even row decoding circuitry 24 and the odd row decoder 25 each include N input terminals 24a and 25a and 2^N output terminals, and the even and odd memory banks 22 and 23 each include 2^N rows, where N is an integer greater than zero. The even column decoding circuitry 26 and the odd column decoder 27 each include M input terminals and 2^M output terminals, and the even and odd memory banks 22 and 23 include 2^M columns, where M is an integer greater than zero.

Referring to FIG. 6, the odd memory bank 23 includes a high-order row H that contains a plurality of the highest odd addresses mapped to the odd memory bank 23. Generally, this high-order row H will contain the M highest odd addresses mapped to the odd memory bank 23, where M is an integer representing the number of columns in the odd memory bank 23. The output terminals of the even row decoding circuitry 24 are arranged from a low-order output terminal L to a high-order output terminal H, with the low-order output terminal L coupled to a corresponding low-order row L of the even memory bank 22 and the high-order output terminal H coupled to a corresponding high-order row H of the even memory bank 22. If the odd starting address A is within this high order row H of the odd memory bank 23, and is not the highest address mapped to the odd memory bank 23, then the even address A+1 resides in the even memory bank 22 in the low-order row L at the column Y+1, where the column Y is enabled by decoding the odd starting address A. Accordingly, even row 24 is configured to "wrap around" from output terminal H to output terminal L when the odd address A is within the high-order row H of the odd memory bank 23.

The sub-circuitry of the even row decoding circuitry 24 is configured so that when the odd starting address A is decoded to activate the high-order output terminal H of the even row decoding circuitry 24, and when the even row decoding circuitry 24 also receives the shift signal on the shift terminal 24b, the sub-circuitry activates the low-order output terminal L of the even row decoding circuitry 24. In this manner, the sub-circuitry provides the even row decoding circuitry 24 with a "wrap-around" function and enables the low-order row of the even memory bank 22 for access when the address A decodes to row H and the shift signal is activated.

When the odd starting address A is within the high-order row H of the odd memory bank 23, the even column decoding circuitry 26 must shift its output terminal to select the correct column of even memory bank 22. The even column decoding circuitry 26 includes a shift terminal 26b coupled to the sub-circuitry. The sub-circuitry is responsive to a signal received through the shift terminal 26b to increment or shift the output terminal 26c activated by decoding the odd starting address A. In this manner, the sub-circuitry activates the output terminal 26d and enables the next column of the even memory bank 22 for access. When the next column is enabled, the second data unit becomes accessible in the low-order row L of the even memory bank, at a column Y+1, where column Y is enabled by decoding the odd starting address A.

A second shift logic 30 determines when the column shift operation takes place and includes a plurality of input terminals 30a–30c and at least one output terminal 30d. The output terminal 30d is coupled to the shift terminal 26b of the even column decoder 26. Each one of the input terminals 30a–30c can receive a signal, with the second shift logic 30 receiving a first signal on line 30a indicating that the starting address A is odd, a second signal on line 30b indicating that multiple data units are being accessed in the single memory access cycle, and at least a third signal on line 30c indicating that the starting address A is within the high-order row H of the odd memory bank 23. This third input signal may be defined by comparing the address A asserted on the address bus to the addresses within the high-order row H. The second shift logic 30 processes the first, second, and third signals to produce a second shift signal on the output terminal 30d of the second shift logic 30. Generally, the second shift logic performs the logical AND of the first, second, and third input signals to produce the second shift signal.

In the memory access system 20 as illustrated in FIGS. 5 and 6, when the starting address A is odd, when multiple data units are accessed in the single memory access cycle, and when the odd starting address A is within the high-order row H of the odd memory bank 23, the first data unit is made accessible by enabling the row H and the column Y of the odd memory bank 23, and the second data unit is made accessible by enabling the row L and the column Y+1 of the even memory bank 22. For example, if the odd starting address is 0x00ff, then the first data unit is accessed by decoding the address 0x00ff to select the high-order output terminal H of odd row decoder 25 and the output terminal 27c. The corresponding address in even memory bank 22, 0x00fe, is incorrect, and the even row decoding circuitry 24 shifts to select the low-order output terminal 24c, and the even column decoding circuitry 26 shifts to select output terminal 26d. In this manner, the correct address for the second data unit, 0x0100, is decoded.

Figure 7:
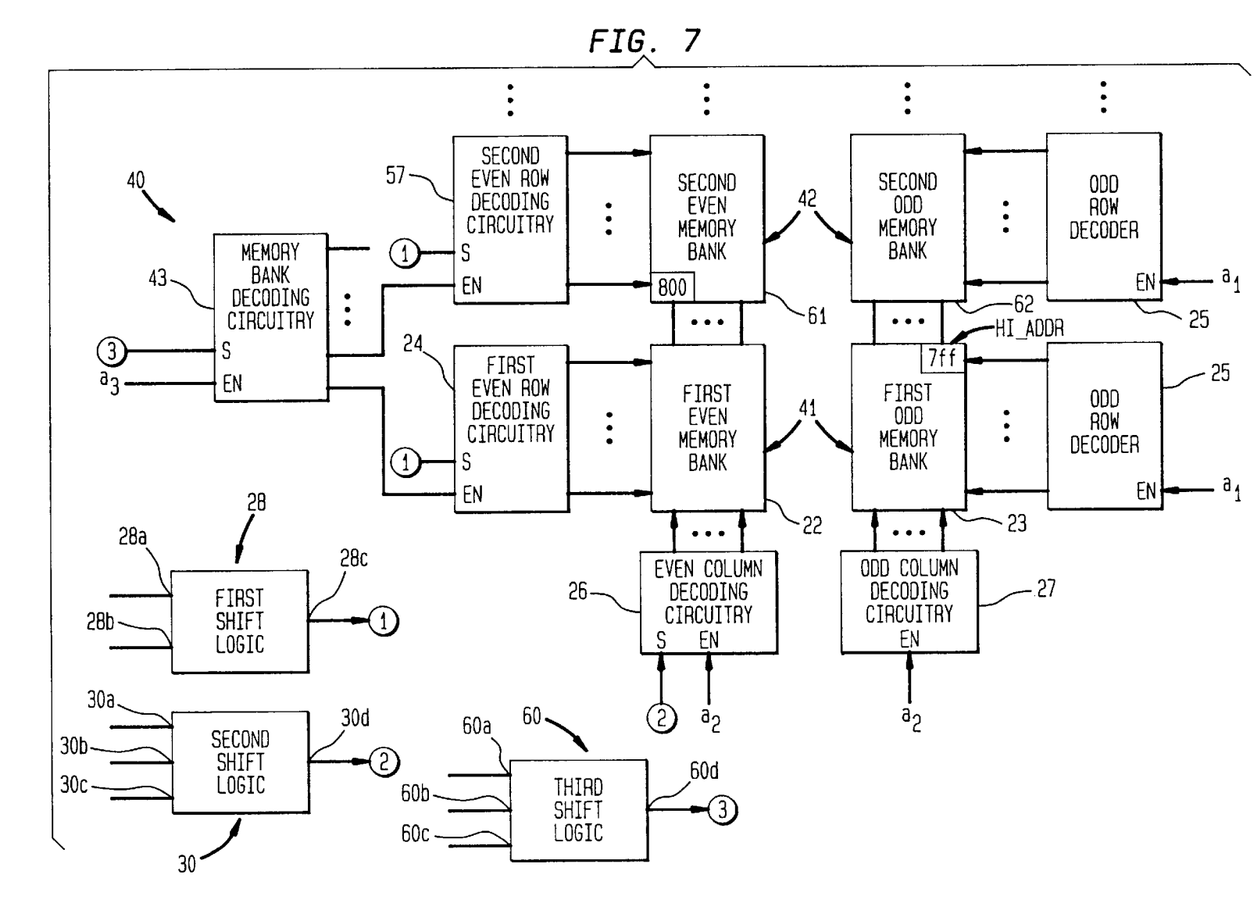
FIG. 7 is a block diagram of a higher-level address decoding system constructed according to one aspect of the invention.

FIG. 7 is a simplified block diagram of a memory access system 40 supporting mis-aligned memory accesses to a first data unit and a second data unit. The system illustrated in FIG. 7 supports single-instruction mis-aligned accesses across two successive memory banks 41 and 42 by extending the row-shift and column-shift operations described above to memory bank decoding circuitry 43. The memory access systems 10 and 20 illustrated in FIGS. 4–6 can access multiple data units, such as a double word consisting of two consecutive words, in a single instruction cycle so long as the data units do not cross a memory bank boundary, such as that between the memory banks 41 and 42 shown in FIG. 7. When a multiple data unit access crosses a memory bank boundary, the memory access systems 10 and 20 must execute a second bus cycle to access the second data unit. Nevertheless, memory access systems 10 and 20 service the vast majority of mis-aligned accesses in a single bus cycle, especially if memory banks 41 and 42 are exemplary 2K memory banks. However, the memory access system 40 as illustrated in FIG. 7 eliminates the occasional cross-bank penalty encountered by memory access systems 10 and 20 when servicing mis-aligned double word accesses that cross memory bank boundaries.

As before in FIGS. 4–6, the first data unit resides at an odd starting address A asserted on an address bus (not shown), and the second data unit resides at an even address A+1. The memory access system 40 comprises at least a first memory 41, first even row decoding circuitry 24, an even column decoding circuitry 26, an odd row decoder 25, an odd column decoder 27, a second memory 42, second even row decoding circuitry 57, memory bank decoding circuitry 43, first shift logic 28, second shift logic 30, and third shift logic 60.

The first memory 41 is interleaved by at least one address bus signal into a first even memory bank 22 mapped to a plurality of even addresses and a first odd memory bank 23 mapped to a plurality of odd addresses. As above in FIGS. 4–6, the first even memory bank 22 and the first odd memory bank 23 are each subdivided into a matrix of storage locations by a plurality of corresponding rows and a plurality of corresponding columns, with one address being mapped to one storage location. The highest address in the odd memory bank 23 is designated by the reference sign HI-ADDR for convenience.

The first even row decoding circuitry 24 in FIG. 7 is the same as that illustrated above in FIGS. 5–6. Here, the first even row decoding circuitry 24 has its enable terminal EN coupled to memory bank decoding circuitry 43. A signal supplied to the enable terminal EN causes the first even row decoding circuitry 24 to become operative, in effect enabling the rows of the first even memory bank 22 for possible access.

The even column decoding circuitry 26, the odd row decoder 25, and the odd column decoder 27 are the same as those illustrated above in FIGS. 5–6.

The second memory 42 is interleaved by at least one address bus signal into a second even memory bank 61 and a second odd memory bank 62. The first even address within the second even memory bank 61 is mapped to the even address immediately following the odd address HI-ADDR in the first odd memory bank 23. The second even memory bank 61 and the second odd memory bank 62 are each subdivided into a matrix of storage locations by a plurality of corresponding rows and a plurality of corresponding columns. One address is mapped to each storage location. One each of the columns of the second even memory bank 61 is coupled to one each of the output terminals of the even column decoding circuitry 26, so that the columns of the first and the second even memory banks 22 and 61 are enabled concurrently by the even column decoding circuitry 26. Likewise, one each of the columns of the second odd memory bank 62 is coupled to one each of the output terminals of the odd column decoder 27, so that the columns of the first and the second odd memory banks 23 and 62 are enabled concurrently by the odd column decoder 27.

The second even row decoding circuitry 57 is structurally the same as the first even row decoding circuitry 24, and includes at least one input terminal and a plurality of output terminals. The input and output terminals are illustrated and discussed above in connection with FIGS. 5 and 6, and are not illustrated in FIG. 7 for clarity. The input terminal of the second even row decoding circuitry 57 is coupled to receive at least the first address bus signal representing the odd starting address A. Each one of the output terminals of the second even row decoding circuitry 57 is coupled to enable one each of the rows of the second even memory bank 61, so that each output terminal corresponds to a row. The second even row decoding circuitry 57 includes sub-circuitry (not shown) coupled between the input terminal and the output terminals of the second even row decoding circuitry 57, with the sub-circuitry decoding the first address bus signal to activate an output terminal.

The second even row decoding circuitry 57 includes a shift terminal and an enable terminal coupled to the sub-circuitry. The sub-circuitry is responsive to a signal supplied to the shift terminals to increment or shift the activated output terminal, thereby activating the next higher-order output terminal and enabling a corresponding next higher-order row of the second even memory bank 61. The sub-circuitry becomes operative in response to a signal supplied to the enable terminal.

The memory bank decoding circuitry 43 includes at least one input terminal and a plurality of output terminals. The memory bank decoding circuitry 43 is structurally similar to the first and second even row decoding circuitry 24 and 57, and its input and output terminals are not specifically illustrated in FIG. 7 for clarity. The input terminal is coupled to at least a third address bus signal representing the odd starting address A. This third address bus signal is decoded to select one of the even row decoding circuitry 24 and 57. One or more address bus signals may be supplied to the memory bank decoding circuitry 43, depending on the requirements of a given addressing scheme. A first one of the output terminals is coupled to the enable EN terminal of the first even row decoding circuitry 24, and a second one of the output terminals is coupled to the enable terminal EN of the second even row decoding circuitry 57. The memory bank decoding circuitry 43 includes sub-circuitry (not shown) coupled between the input terminal and the output terminals. The sub-circuitry decodes the third address bus signal to activate one of the output terminals, thereby enabling one of the first even row decoding circuitry 24 and the second even row decoding circuitry 57 for operation.

The memory bank decoding circuitry 43 includes a shift terminal coupled to the sub-circuitry, with the sub-circuitry being responsive to a signal received through the shift terminal to increment the output terminal activated by decoding the third address signal to activate a next higher-order output terminal of the memory bank decoder 43. In this manner, the decoding circuit 24 or 57 coupled to the activated output terminal of the memory bank decoding circuitry is enabled. Also, the memory bank decoding circuitry 43 is configured with the same "wrap around" function as are the decoding circuits 24 and 57.

The first shift logic 28 and the second shift logic 30 are identical to the shift logic 28 illustrated above in FIG. 5. First shift logic 28 controls the row-shift operations of the even row decoding circuitry 24 and 57. Second shift logic 30 controls the column-shift operations of even column decoding circuitry 26. The output terminal of shift logic 28 is coupled to the shift terminal of first and second even row decoding circuitry 24 and 57, and the output terminal of the shift logic 30 is coupled to the shift terminal of even column decoding circuitry 26.

The third shift logic 60 controls the memory bank shift function, and includes a plurality of input terminals 60a–60c and at least one output terminal 60d. Each one of the input terminals 60a–60c can receive a signal, with the third shift logic 60 receiving a first signal on line 60a indicating that the starting address A is odd, a second signal on line 60b indicating that multiple data units are being accessed in the single memory access cycle, and at least a third signal on line 60a indicating that the starting address A is the highest address HI-ADDR in the odd memory bank 23. The third shift logic 60 processes the first, second, and third signals to produce a third shift signal on the output terminal 60d. The output terminal 60d is coupled to the shift terminal of the memory bank decoding circuitry 43.

When the odd starting address A is the highest odd address HI-ADDR (for example, 0x07ff) mapped to the first odd memory bank 23, the memory bank decoding circuitry 43 enables the second even row decoding circuitry 57 for operation in response to the third shift signal. The first and the second even row decoding circuitry 24 and 57 initially enable the high order row of first and second even memory banks 22 and 61 in response to the first address bus signal, but then shift in response to the first shift signal to enable a low-order row of the first and the second even memory banks 22 and 61 respectively. The even column decoding circuitry 26 initially enables the high order column of the even memory banks 22 and 61, but then shifts in response to the second shift signal to enable a low-order column of the even memory banks 22 and 61. In this manner, the memory access system 40 makes the second data unit in the second even memory bank 57 accessible at the storage location corresponding to the low-order row and the low-order column, along with the first data unit residing in the highest odd address in the first odd memory bank 23.

Figure 8:
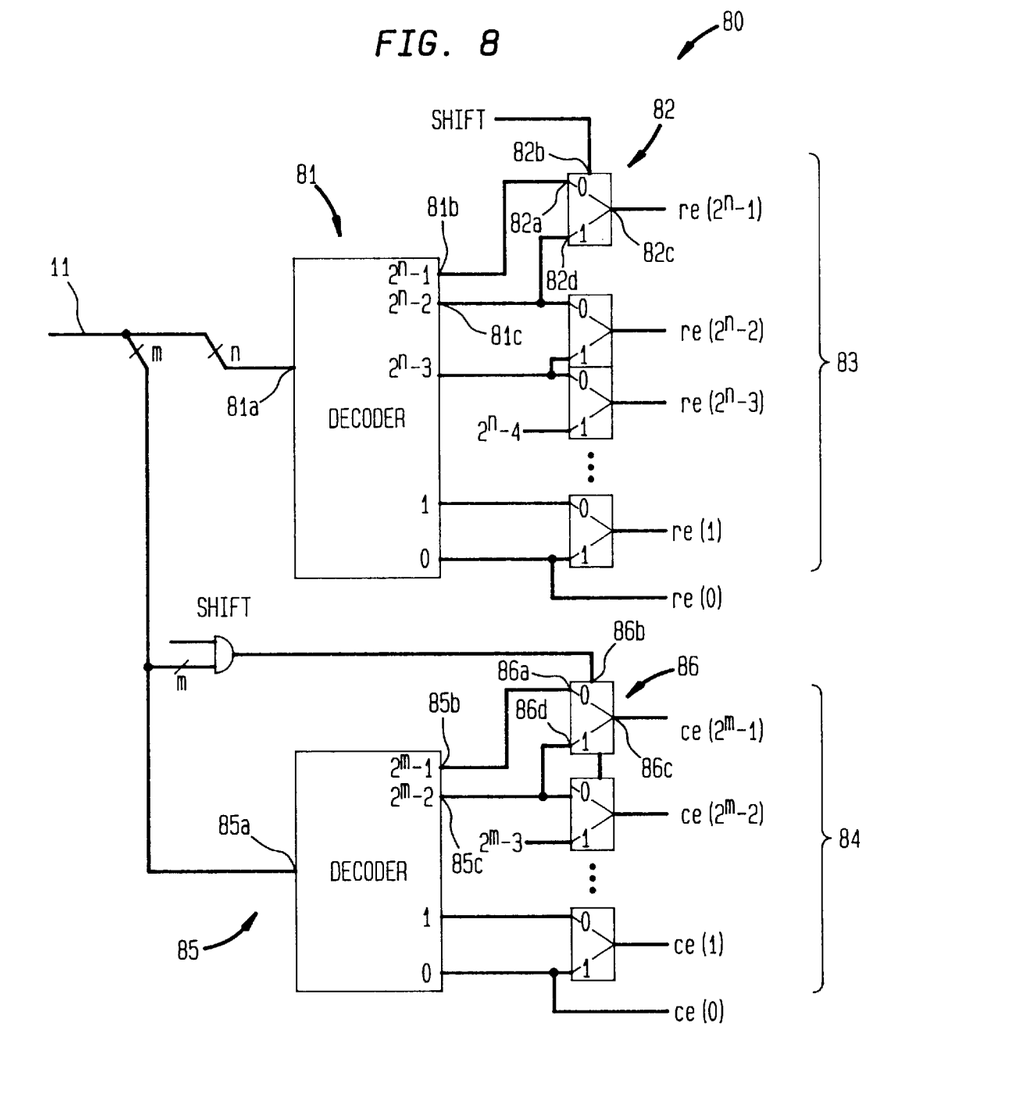
FIG. 8 is a schematic diagram of an exemplary decoding circuit constructed in accordance with one aspect of the invention.

FIG. 8 is a schematic diagram of an exemplary decoding circuit 80 constructed in accordance with one aspect of the invention. According to one aspect of the invention, decoding circuit 80 is used to construct the memory bank decoding circuitry 43, the even row decoding circuits 24 and 57, and the even column decoding circuitry 26.

As illustrated in FIG. 8, the decoding circuit 80 includes first and second decoders 81 and 85, a first plurality of multiplexers 82, and a second plurality of multiplexers 85. Conceptually, the first decoder 81 and the first plurality of multiplexers 82 constitute a first sub-circuit 83, and the second decoder 85 and the second plurality of multiplexers 86 constitute a second sub-circuit 84. The first sub-circuit 83 produces the row-enable signals that select one of the rows of the even memory bank, as illustrated in FIGS. 4, 5, and 7. The second sub-circuit 84 produces the column-enable signals that select one of the columns of the even memory bank, as illustrated in FIGS. 5 and 7.

It should be understood that the decoding circuit 80 as illustrated in FIG. 8 is exemplary only, and that the first sub-circuit 83 and the second sub-circuit 84 can be implemented separately. Specifically, the first sub-circuit 83 typically forms the sub-circuitry of the memory bank decoding circuitry 43 and the even row decoding circuits 24 and 57, while the second sub-circuit 84 typically forms the sub-circuitry of the even column decoding circuitry 26.

The first and second decoders 81 and 85 each include at least one input terminal 81a and 85a, respectively, a first output terminal 81b and 85b respectively, and a second output terminal 81c and 85c. In general, the first and second decoders 81 and 85 are each configured with N input terminals 81a and 85a, and $2^N$ output terminals 81b–81c and 85b–85c, where N is a nonzero positive integer. Address bus signals N are routed from address bus 11 to the input terminal 81a, and address bus signals M are routed from address bus 11 to the input terminal 85a. The first decoder 81 decodes the address bus signals N to select one of the output terminals 81b–81c. The second decoder 85 decodes the address bus signals M to select one of the output terminals 85b–85c.

The output terminals 81b–81c of the first decoder 81 are arranged in ascending order, for example with output terminal 81c having lower-order than output terminal 81b. These output terminals 81b–81c correspond to rows of the even memory bank, such that output terminal 81b, if passed straight through multiplexer 82 without shifting, would enable a higher-order row of the even memory bank than would output terminal 81c if similarly passed-through without shifting.

The output terminals 85b and 85c of the first decoder 85 are similarly arranged in order, with output terminal 85b having higher order than output terminal 85c. These output terminals 85b–85c correspond to the lower and higher columns, respectively, of the even memory banks.

A multiplexer 82 includes a first input terminal 82a coupled to decoder output terminal 81b, a second input terminal 82d coupled to decoder output terminal 81c, a control input 82b coupled to receive a shift signal, and an output terminal 82c coupled to enable a row of the even memory bank. The control input 82b is coupled to receive a shift signal such as that produced by the first shift logic 28 (not shown in FIG. 8). The output terminal 82c is coupled to enable a row of the even memory bank (not shown in FIG. 8). In this configuration, the multiplexer 82 is responsive to the shift signal to couple either the first output terminal 81b or the second output terminal 81c to the output terminal 82c of the multiplexer 82.

If the shift signal applied to control input 82b is inactive, for example in a logical zero state, the multiplexer 82 couples the higher-order output terminal 81b of the decoder 81 to the output terminal 82c, effectively passing the activated row as enabled by decoder 81 straight through without any shifting of order. Conversely, if the shift signal is active, for example in a logical one state, the multiplexer 82 couples the lower-order output terminal 81c to the output terminal 82c, effectively shifting the order of the output terminal 81c as the signal from that terminal passes through multiplexer 82. In this manner, a given row of the even memory bank coupled to the output terminal 82c of the multiplexer 82 is enabled either by a signal from output terminal 81b, which has order equivalent with that row of the even memory bank, or by a signal from output terminal 81c, which has lower order than that row of the even memory bank, depending on the state of the signal applied to control input 82b. In this manner, the lower-order output terminal 81c is "shifted" to enable a higher-order row of the even memory bank through output terminal 82c.

The same shifting operation described above relating to first sub-circuit 83 applies equally to the second sub-circuit 84 and will not be repeated. Thus, the first output terminal 85b is coupled to the multiplexer input terminal 86a and the second output terminal 85c is coupled to the multiplexer input terminal 86d. One difference between the first sub-circuit 83 and the second sub-circuit 84 is the derivation of the shift signal applied to the control input 86b of multiplexer 86. In the second sub-circuit 84, the shift signal as supplied to first sub-circuit 83 is processed with the M address bus signals to determine whether the address asserted on address bus 11 falls within the top row of the odd memory bank. If so, the second sub-circuit 84 should shift columns to properly select the second data unit in the first row of the even memory bank.

The decoding circuit 80 shown in FIG. 8 can be implemented with pass-gate multiplexers, tri-state drivers, combinatorial multiplexers, or other equivalent circuits providing the function of selectively coupling one of a high-order or a low-order input terminal to a single output terminal. It should also be noted that adding the multiplexers 82 and 86 to the decoding circuit 80 will not substantially impact the access time of the memory access system because the gate delay of a single multiplexer 82 or 86 is short enough that the multiplexing operation may be completed during the operation of other drive circuits in the memory access system.

As an alternative to the decoding circuit shown in FIG. 8, the lines that are input to the decoders 81 and 85 could be pre-processed so as to effectively pre-shift the input address before it is decoded, rather than post-processing the row/column enable signals after decoding, as done in FIG. 8.

Although illustrated and described herein with reference to certain specific embodiments, the present invention is nevertheless not intended to be limited to the details shown. Rather, various modifications may be made in those details within the scope and range of equivalents of the claims and without departing from the spirit of the invention. For example, FIG. 7 illustrates two even row decoding circuits 24 and 57 and two corresponding even memory banks 22 and 61, but any number of even row decoding circuits and corresponding even memory banks could be employed consistent with the instant invention. Also, FIG. 7 illustrates the shifting concept as extended to the memory bank decoder 43. The same concept could be readily be extended farther to the decoding circuits at higher levels than memory bank decoder 43.

What is claimed:

1. A memory access system for accessing a first data unit and a second data unit in a single memory access cycle, the first data unit residing at an odd starting address a asserted on an address bus, the second data unit residing at a next sequential even address the memory access system comprising:

a memory interleaved by at least one address bus signal into an even memory bank mapped to a plurality of even addresses and an odd memory bank mapped to a plurality of odd addresses, the even memory bank and the odd memory bank each organized by a plurality of corresponding rows, each one of the rows containing at least one storage location for a data unit with one address mapped to one storage location;

even address decoding circuitry coupled to the address bus to receive an address bus signal representing the odd starting address A and coupled to enable one of the rows of the even memory bank by decoding the address bus signal;

odd address decoding circuitry coupled to receive the address bus signal representing the odd starting address and coupled to enable one of the rows of the odd memory bank by decoding the address bus signal; and     shift logic responsive to a first signal indicating that the starting address is odd and to a second signal indicating that multiple data units are being accessed in the single memory access cycle to produce a shift signal, the even address decoding circuitry being responsive to the shift signal to increment the row of the even memory bank enabled by decoding the address bus signal;

whereby the first data unit is accessed at the row of the odd memory bank enabled by decoding the address bus signal and the second data unit is accessed at the row of the even memory bank enabled in response to the shift signal when the starting address is odd and multiple data units are accessed in the same memory access cycle.

2. The memory access system of claim 1, wherein the even address decoding circuitry includes a decoder and a multiplexer;

the decoder including an input terminal and a plurality of output terminals, read the input terminal of the decoder coupled to receive the address bus signal, the decoder activating one of the output terminals in response to the address bus signal; and     the multiplexer including a plurality of input terminals, a control input, and an output terminal, the multiplexer output terminal coupled to enable a row of the even memory bank, a first multiplexer input coupled to a first decoder output, a second multiplexer input coupled to a second decoder output, the multiplexer control input coupled to receive the shift signal, the multiplexer being responsive to the shift signal to couple one of the decoder output terminals to the multiplexer output terminal.

3. The memory access system of claim 1, wherein the even address decoding circuitry and the odd address decoding circuitry each include N input terminals for coupling to N address bus signals representing the odd starting address A, wherein the even address decoding circuitry and the odd address decoding circuitry each include $2^N$ output terminals, wherein the even and odd memory banks each include $2^N$ rows, where N is an integer greater than zero.

4. A memory access system for accessing a first data unit and a second data unit in a single memory access cycle, the first data unit residing at an cold starting address a asserted on an address bus, the second data unit residing at a next sequential even address, the memory access system comprising:

a memory interleaved by at least one address bus signal into an even memory bank mapped to a plurality of even addresses and an odd memory bank mapped to a plurality of odd addresses, the even memory bank and the odd memory bank each being subdivided into a matrix of storage locations by a plurality of corresponding rows and a plurality of corresponding columns, with one address being mapped to one storage location;

even row decoding circuitry coupled to the address bus to receive a first address bus signal and coupled to enable one of the rows of the even memory bank by decoding the first address bus signal, the even row decoding circuitry including a shift terminal and being responsive to a signal supplied to the shift terminal to increment the row of even memory bank enabled by decoding the first address bus signal;

even column decoding circuitry coupled to the address bus to receive a second address bus signal and coupled to enable one of the columns of the even memory bank by decoding the second address bus signal;

an odd row decoder coupled to the address bus to receive the first address bus signal and coupled to enable one of the rows of the odd memory bank by decoding the first address bus signal;

an odd column decoder coupled to the address bus to receive the second address bus signal and coupled to enable one of the columns of the odd memory bank by decoding the second address bus signal; and first shift logic responsive to a first signal indicating that the address bus contains an odd address and to a second signal indicating that multiple data units are being accessed in the current instruction cycle to produce a shift signal, the even row decoding circuitry being responsive to the shift signal to increment the row of the even memory bank enabled by decoding the first address bus signal;

whereby the first data unit is made accessible by decoding the first and second address bus signals, and the second data unit is made accessible by decoding the first and second address bus signals and incrementing the enabled row of the even memory bank when the starting address A is odd and multiple data units are accessed in the single memory access cycle.

5. The memory access system of claim 4, wherein the even row decoding circuitry and the odd row decoder each include N input terminals and $2^N$ output terminals, wherein the even and odd memory banks each include $2^N$ rows, and wherein the even column decoding circuitry and the odd column decoder each include M input terminals and $2^M$ output terminals, wherein the even and odd memory banks include $2^M$ columns, where N and M are integers greater than zero.

6. The memory access system of claim 4, wherein the even row decoding circuitry includes a decoder and a multiplexer;

the decoder including an input terminal and a plurality of output terminals, read the input terminal of the decoder coupled to receive the address bus signal, the decoder activating one of the output terminals in response to the address bus signal; and the multiplexer including a plurality of input terminals, a control input, and an output terminal, the multiplexer output terminal coupled to enable a row of the even memory bank, a first multiplexer input coupled to a first decoder output, a second multiplexer input coupled to a second decoder output, the multiplexer control input coupled to receive the shift signal, the multiplexer being responsive to the shift signal to couple one of the decoder output terminals to the multiplexer output terminal.

7. The memory access system of claim 4, wherein the even column decoding circuitry includes a decoder and a multiplexer;

the decoder including an input terminal and a plurality of output terminals, read the input terminal of the decoder coupled to receive the address bus signal, the decoder activating one of the output terminals in response to the address bus signal; and the multiplexer including a plurality of input terminals, a control input, and an output terminal, the multiplexer output terminal coupled to enable a row of the even memory bank, a first multiplexer input coupled to a first decoder output, a second multiplexer input coupled to a second decoder output, the multiplexer control input coupled to receive the shift signal, the multiplexer being responsive to the shift signal to couple one of the decoder output terminals to the multiplexer output terminal.

8. The memory access system of claim 4, wherein:

the odd memory bank includes a high-order row containing a plurality of the highest odd addresses mapped to the odd memory bank;

the rows of the even memory bank are arranged from a low-order row to a high-order row, the even row decoding circuitry is configured so that when the odd starting address resides in the high-order row of the odd memory bank and when the first shift signal is activated, the even row decoding circuitry enables the low-order row of the even memory bank;

the memory access system further comprising second shift logic responsive to a first signal indicating that the starting address is odd, to a second signal indicating that multiple data units are being accessed in the single memory access cycle, and to at least a third signal indicating that the starting address is within the high-order row of the odd memory bank to produce a second shift signal, the even column decoding circuitry being responsive to the second shift signal to increment the column of the even memory bank enabled by decoding the second address bus signal;

whereby the first data unit is made accessible by decoding the first and the second address bus signals, and the second data unit is made accessible by decoding the first and the second address bus signals and incrementing the enabled column of the even memory bank when the starting address is odd, when multiple data units are accessed in the single memory access cycle, and when the odd starting address is within the high-order row of the odd memory bank.

9. A memory access system for accessing a first data unit and a second data unit in a single memory access cycle, the first data unit residing at an odd starting address asserted on an address bus, and the second data unit residing at an even address the memory access system comprising:

a first memory interleaved by at least one address bus signal into a first even memory bank mapped to a plurality of even addresses and a first odd memory bank mapped to a plurality of odd addresses, the first even memory bank and the first odd memory bank each being subdivided into a matrix of storage locations by a plurality of corresponding rows and a plurality of corresponding columns;

first even row decoding circuitry coupled to receive at least a first address bus signal representing the odd starting address and coupled to enable one of the rows of the first even memory bank by decoding the first address bus signal;

even column decoding circuitry coupled to receive at least a second address bus signal representing the odd address and coupled to enable one of the columns of the even memory bank by decoding the second address bus signal;

an odd row decoder coupled to receive the first address bus signal and coupled to enable one of the rows of the odd memory bank by decoding the first address bus signal;

an odd column decoder coupled to receive the second address bus signal and coupled to enable one of the columns of the odd memory bank by decoding the second address bus signal;

a second memory interleaved by at least one address bus signal into a second even memory bank and a second odd memory bank, the first even address within the second even memory bank mapped to an even address immediately following the highest address in the odd memory bank, the second even memory bank and the second odd memory bank each subdivided into a matrix of storage locations by a plurality of corresponding rows and a plurality of corresponding columns, the columns of the second even memory bank coupled to be enabled by the even column decoder, so that the columns of the first and the second even memory banks are enabled concurrently by the even column decoder;

second even row decoding circuitry coupled to receive at least the first address bus signal and coupled to enable one of the rows of the second even memory bank;

at least one memory bank decoder coupled to receive at least a third address bus signal representing the odd starting address A and coupled to enable one of the first even row decoding circuitry and the second even row decoding circuitry by decoding the third address bus signal;

first shift logic responsive to a first signal indicating that the starting address is odd and to a second signal indicating that multiple data units are being accessed in the single memory access cycle to produce a first shift signal, the first even row decoder and the second even row decoder being responsive to the first shift signal to increment the rows of the first and second even memory banks enabled by decoding the first address bus signal;

second shift logic responsive to a first signal indicating that the starting address is odd, to a second signal indicating that multiple data units are being accessed in the single memory access cycle, and to at least a third signal indicating that the starting address is within a high-order row of the odd memory bank, the second shift logic processing the first, second, and third signals to produce a second shift signal, the even column decoding circuitry being responsive to the second shift terminal to increment the column of the first and second even memory banks enabled by decoding the second address bus signal; and third shift logic responsive to a first signal indicating that the starting address is odd, to a second signal indicating that multiple data units are being accessed in the single memory access cycle, and to at least a third signal indicating that the starting address is the highest address in the odd memory bank, the third shift logic processing the first, second, and third signals to produce a third shift signal, the memory bank decoder being responsive to the third shift signal to increment the even row decoding circuitry enabled by decoding the third address bus signal.

10. The system of claim 9, wherein the first and the second even row decoding circuitry each include N input terminals and 2^N output terminals, where N is an integer greater than zero.

11. The system of claim 9, wherein the even column decoding circuitry includes M input terminals and 2^M output terminals, where M is an integer greater than zero.

12. The memory access system of claim 9, wherein the first and the second even row decoding circuitry each include a decoder and a multiplexer;

the decoder including an input terminal and a plurality of output terminals, read the input terminal of the decoder coupled to receive the address bus signal, the decoder activating one of the output terminals in response to the address bus signal; and the multiplexer including a plurality of input terminals, a control input, and an output terminal, the multiplexer output terminal coupled to enable a row of the even memory bank, a first multiplexer input coupled to a first decoder output, a second multiplexer input coupled to a second decoder output, the multiplexer control input coupled to receive the shift signal, the multiplexer being responsive to the shift signal to couple one of the decoder output terminals to the multiplexer output terminal.

13. The memory access system of claim 9, wherein the even column decoding circuitry includes a decoder and a multiplexer;

the decoder including an input terminal and a plurality of output terminals, read the input terminal of the decoder coupled to receive the address bus signal, the decoder activating one of the output terminals in response to the address bus signal; and the multiplexer including a plurality of input terminals, a control input, and an output terminal, the multiplexer output terminal coupled to enable a row of the even memory bank, a first multiplexer input coupled to a first decoder output, a second multiplexer input coupled to a second decoder output, the multiplexer control input coupled to receive the shift signal, the multiplexer being responsive to the shift signal to couple one of the decoder output terminals to the multiplexer output terminal.

14. The memory access system of claim 9, wherein the memory bank decoding circuitry includes a decoder and a multiplexer;

the decoder including an input terminal and a plurality of output terminals, read the input terminal of the decoder coupled to receive the address bus signal, the decoder activating one of the output terminals in response to the address bus signal; and the multiplexer including a plurality of input terminals, a control input, and an output terminal, the multiplexer output terminal coupled to enable a row of the even memory bank, a first multiplexer input coupled to a first decoder output, a second multiplexer input coupled to a second decoder output, the multiplexer control input coupled to receive the shift signal, the multiplexer being responsive to the shift signal to couple one of the decoder output terminals to the multiplexer output terminal.

15. A method for accessing a first data unit and a second data unit in a single memory access cycle, the first data unit residing at an odd starting address, the second data unit residing at a next sequential even address, the method comprising the steps of:

providing a memory interleaved by at least one address bus signal into an even memory bank mapped to a plurality of even addresses and an odd memory bank mapped to a plurality of odd addresses, the odd memory bank and the even memory bank being organized by at least a plurality of rows;

asserting the odd starting address onto an address bus;

decoding at least one address bus signal to enable a row in the odd memory bank and the even memory bank, shifting the row enabled in the even memory bank to enable a next row in the even memory bank; and accessing the first data unit in the row enabled in the odd memory bank; and accessing the second data unit in the row enabled in the even memory bank.

16. The method of claim 15, wherein the step of providing a memory includes providing an even memory bank and an odd memory bank each subdivided into a matrix of storage locations by a plurality of corresponding rows and a plurality of corresponding columns, with one address being mapped to one storage location;

further comprising the step of decoding at least one address bus signal to enable a column in the even and odd memory banks;

further comprising the step of shifting the column enabled in the even memory bank and enabling a low-order row of the even memory bank when the starting address resides in a high-order row of the odd memory bank;

wherein the step of accessing the first data unit includes accessing the first data unit in the row and column enabled in the odd memory bank; and wherein the step of accessing the second data unit includes accessing the second data unit in the row and column enabled in the even memory bank.

17. The method of claim 16, further comprising the step of providing a second memory interleaved by at least one address bus signal into a second even memory bank mapped to a plurality of even addresses and a second odd memory bank mapped to a plurality of odd addresses, the first even address in the second even memory bank following the highest odd address in the first odd memory bank, the second even memory bank and the second odd memory bank each subdivided into a matrix of storage locations by a plurality of corresponding rows and a plurality of corresponding columns; and further comprising the step of enabling a low-order row and a low-order column of the second even memory bank when the odd starting address is the highest odd address in the first odd memory bank.

18. The method of claim 15, wherein the steps of decoding and shifting are executed in the single memory access cycle.

* * * * *